United States Patent [19]

Cziment

[11] 4,228,317

[45] Oct. 14, 1980

[54] PROTECTIVE FACE PLATE FOR AN ELECTRICAL OUTLET

[76] Inventor: Norbert Cziment, 1881 49th St., Brooklyn, N.Y. 11204

[21] Appl. No.: 959,674

[22] Filed: Nov. 13, 1978

[51] Int. Cl.[2] ................................................ H05K 5/03

[52] U.S. Cl. ........................................ 174/67; 220/242; 339/44 R

[58] Field of Search .......................... 174/67; 220/242; 339/36, 44 R, 44 M, 43

[56] References Cited

U.S. PATENT DOCUMENTS

| | | | |
|---|---|---|---|
| 1,399,899 | 12/1921 | Sontgerathe et al. | 220/242 |
| 2,728,894 | 12/1955 | Peters | 174/67 X |
| 2,932,811 | 4/1960 | Abraham et al. | 339/44 R X |
| 3,621,115 | 11/1971 | Kloster | 220/242 X |
| 3,956,573 | 5/1976 | Myers et al. | 174/67 X |

*Primary Examiner*—B. A. Reynolds
*Assistant Examiner*—D. A. Tone
*Attorney, Agent, or Firm*—Friedman, Goodman & Teitelbaum

[57] ABSTRACT

A face plate for an electrical outlet which provides a safety covering for the socket receptacles. The face plate includes a base member which has an outer shell that can be positioned over the electrical outlet. A recessed compartment is located within the outer shell. A bottom wall of the recessed compartment has a pair of socket openings which can be aligned with a duplex socket receptacle of the electrical outlet. A removable insert member is snap-fit into the recessed compartment, and in conjunction with the outer shell forms a flush surface. The insert member includes a pair of covers which can be selectively opened in order to uncover each one of the socket openings. Cooperating portions on the base member and the insert member securely retain the insert member in the recessed compartment. Both the base member and the insert member are symmetrically formed so as to be reversably positionable with respect to each other.

15 Claims, 10 Drawing Figures

FIG.1
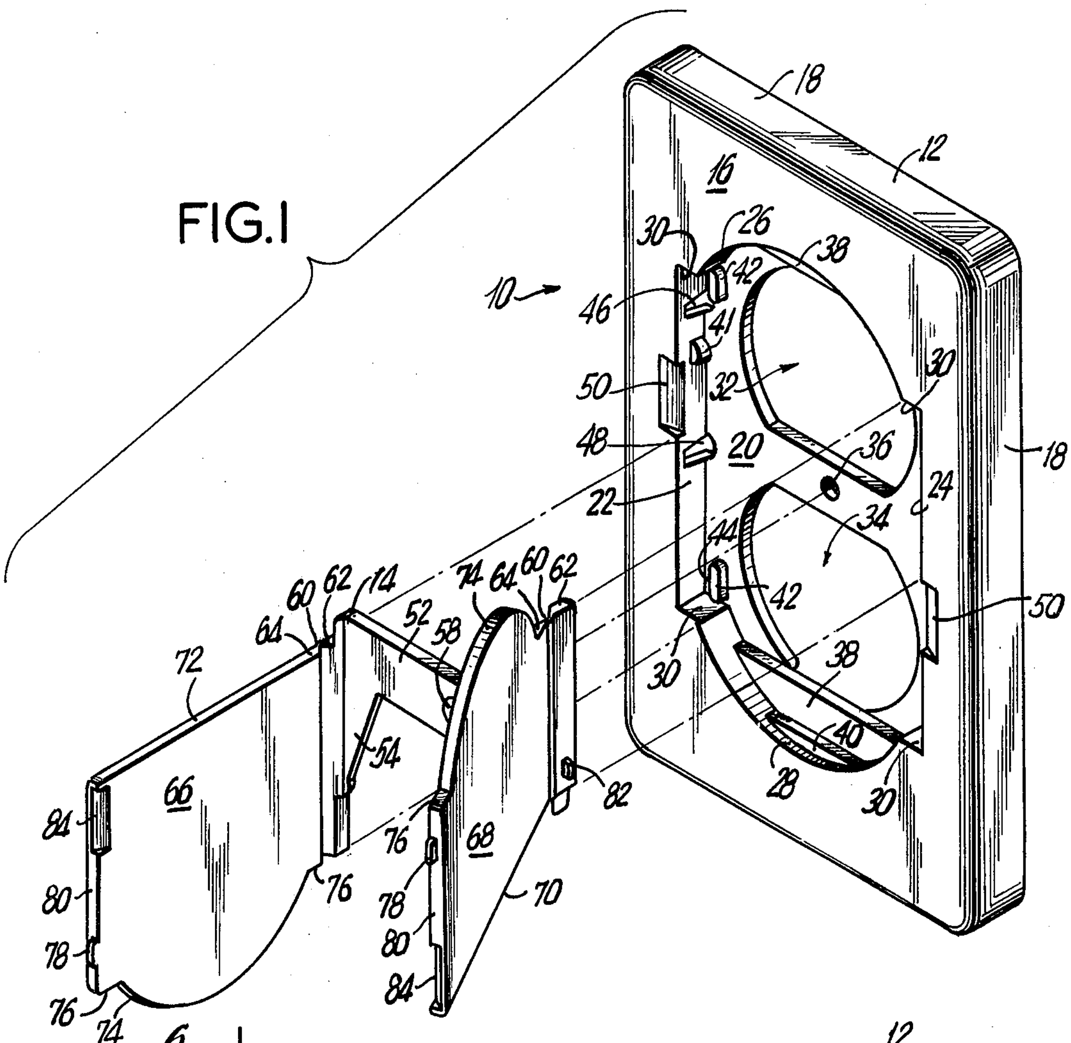
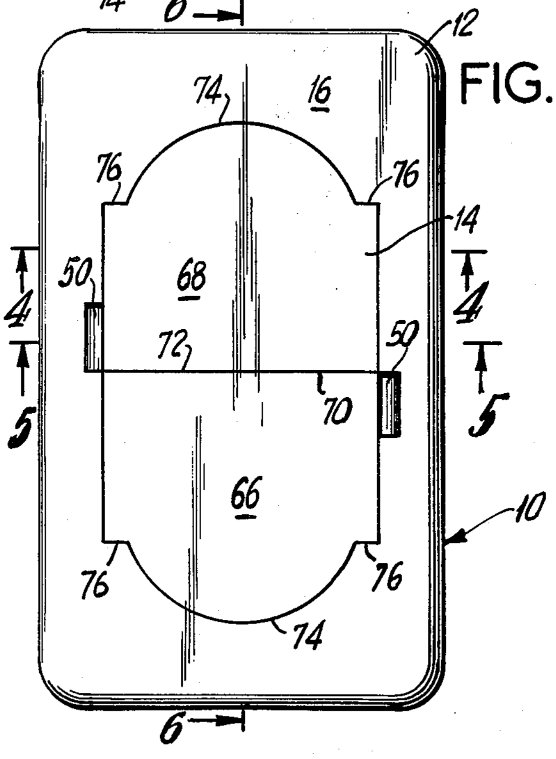
FIG.2
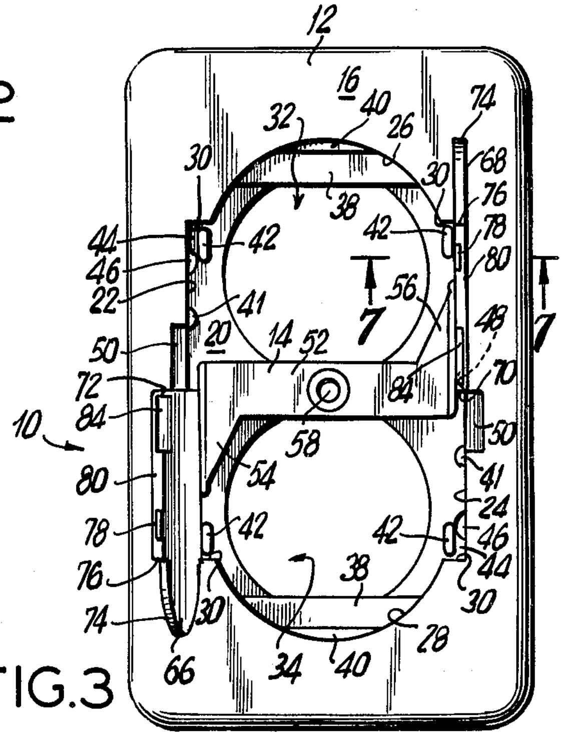
FIG.3

PROTECTIVE FACE PLATE FOR AN ELECTRICAL OUTLET

BACKGROUND OF THE INVENTION

This invention relates to face plates for electrical outlets, and more particularly to a face plate including safety protection means which normally cover the socket receptacles of the electrical outlet.

Electrical outlets are generally placed throughout a building whereby electrical apparatus can be interconnected to the main electrical power lines. The electrical outlets typically include socket receptacles, generally of the duplex socket receptacle type, which are placed in an electrical box through which the wires are connected. In order to cover the electrical box and prevent access to the wires, a face plate is generally positioned over the electrical outlet. The face plate is usually shaped to cover the electrical box and overlap onto the adjacent wall to provide a decorative finish to the outlet. Openings are provided in the face plate in alignment with the socket receptacles, so that a plug can easily be inserted into any one of the socket receptacles. Typically, the face plates are provided with decorations to permit blending of the face plate into the surrounding decor of the wall covering.

Although the typical face plate prevents access to the wires in the electrical box, the socket receptacles themselves are uncovered and provide an attractive nuisance to children and other individuals, and thus may cause great harm. Because of the easy access to the electrical socket receptacles, a child can insert a piece of metal into the openings in the socket receptacles, and may be severly harmed. Also, even adults may accidentally push against the socket receptacles with a piece of metal and accidentally cause a short circuit or a fire by such accidental encounter with the socket receptacles.

In order to avoid the safety hazard of an uncovered socket receptacle in a wall outlet, there has been suggested numerous protective devices for covering the socket receptacle when not in use. Some of these devices include individual plates which can be selectively removed to uncover the socket receptacle which is to be utilized. However, these plates tend to get lost or misplaced, and are a nuisance to continuously remove and store. Other devices include a complete housing which fits over the face plate. However, such housing must itself be removed in order to gain access to the socket receptacles. Still other devices have included complex spring mechanisms which must be turned or pushed in order to uncover the socket receptacles. Because of these complex mechanisms, the cost of these devices are fairly high and their tendency to break is quite prevelant.

Additionally, most of the prior art devices were not very aesthetic. In most cases the safety protector constituted a cover member separate from the standard face plate. While the face plate may be specifically designed to meet the aesthetic requirement of the wall decor, the protective safety device was of a separate color or decoration and would not match the face plate or the wall decor. As a result, in order to achieve the safety needed, the aesthetics were sacrificed.

SUMMARY OF THE INVENTION

It is accordingly an object of the present invention to provide a face plate for an electrical outlet which avoids the aforementioned problems of prior art devices.

Still another object of the present invention is to provide a face plate for an electrical outlet which includes an integral safety protective cover which normally prevents access to the electrical socket receptacles when not in use.

A further object of the present invention is to provide a safety plate for an electrical outlet having a duplex socket receptacle, and wherein the face plate can selectively cover each of the socket receptacles when not in use.

Still another object of the present invention is to provide a face plate for an electrical outlet which is symmetrically formed, whereby it can be reversibly positioned over the electrical outlet.

A further object of the present invention is to provide a face plate for an electrical outlet which includes a base member which can be utilized as a standard face plate, and which further includes a safety insert member for selectively covering the socket receptacles of the outlet, and wherein the insert member and the base member are both symmetrically formed so as to be reversible with respect to each other.

Another object of the present invention is to provide a face plate for an electrical outlet which is easy to install, and which also provides a protective covering over the outlet when not in use.

Still another object of the present invention is to provide a face plate for an eletrical outlet which provides a protective covering for the electrical socket receptacles, and which can be aesthetically designed to match wall decors.

A further object of the present invention is to provide a face plate for an electrical outlet which includes a safety protective covering for the electrical socket receptacles, and which is relatively inexpensive to manufacture, easy to assemble, simple to install, and requires little maintenance.

Briefly, the present invention provides a face plate for an electrical outlet which includes a base member and a protective insert cover member. The base member has an outer shell which is adapted to be positioned over the electrical outlet. A recessed compartment is defined within the outer shell and includes a bottom wall having a pair of socket openings for alignment with a duplex socket receptacle of the outlet. The insert member, which is removable, is received in the recessed compartment. The insert member forms, in cooperation with the outer shell, a flush surface to the face plate. The insert member has a pair of covers which can be selectively opened to uncover each of the socket openings disposed therebeneath. Cooperating portions on the base member and the insert member serve to securely retain the insert member in the recessed compartment. The base member and the insert member are each symmetrically formed so as to be reversibly positioned with respect to each other.

BRIEF DESCRIPTION OF THE DRAWINGS

With the above and additional objects and advantages in view, as will hereinafter appear, this invention comprises the devices, combinations and arrangements of parts hereinafter described by way of example and illustrated in the accompanying drawings of a preferred embodiment in which:

FIG. 1 is an exploded perspective view of the face plate showing the base member and the removable insert member according to the present invention;

FIG. 2 is a front elevational view of the face plate showing the covers of the insert member in their closed position;

FIG. 3 is a front elevational view of the face plate showing both covers of the insert member in their respective open positions;

In the various figures of the drawing, like reference characters designate like parts.

DETAILED DESCRIPTION OF THE PREFERRED EMBODIMENT

Figure 4:
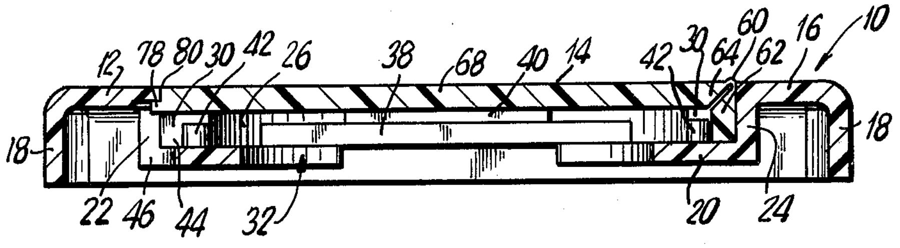
FIG. 4 is a sectional view taken along line 4—4 of FIG. 2.

Referring now to the drawings, the face plate 10 of the present invention is shown to include two separable sections, which are a base member, shown generally at 12, and a removable insert member, shown generally at 14. The base member is formed as an outer shell of substantially rectangular configuration having a forward wall 16 and a rearwardly directed peripheral flange 18. The size of the outer shell is such as to permit the base member to be placed over an electrical outlet so that it covers the electrical box and overlies the adjacent wall area thereby closing and protecting entrance into the electrical box. A recessed compartment is disposed within the outer shell and includes a base or bottom wall 20. The side walls 22 and 24 interconnect the bottom wall 20 with the forward wall 16 along the side portions. There are also provided an upper end wall 26 and a lower end wall 28 also interconnecting the rear wall 20 with the forward wall 16 along its upper and lower end portions. The upper and lower end walls 26, 28 are each formed in an arcuate shape with side shoulders 30. However, the shape may be modified to accommodate other configurations for aesthetic value.

The bottom wall 20 has a pair of socket openings 32, 34 vertically aligned with each other and symmetric about a transverse center line. The socket openings 32, 34 are positioned to be in alignment with a duplex socket receptacle contained in the electrical outlet. Located centrally of the bottom wall 20 and spaced between the two socket openings is a clearance hole 36 for use in mounting the base member 12 over the outlet.

Across opposite end portions of the bottom wall 20 are raised shelves 38 extending transversely across the arcuate sections 26, 28 of the upper and lower interconnecting end walls. On each raised shelf 38, adjacent the arcuate sections 26, 28, is a support member 40, shown in FIGS. 1, and 3–6 as an integral step positioned at the edge of the arcuate sections 26, 28. The support members 40 are laterally spaced apart from each other and are symmetrical at the upper and lower ends of the base member 12. Additional support members 41, having a semi-circular shape, extend outwardly from the side walls 22, 24 and upwardly from the bottom wall 20. Preferably, there is one support member 41 on each side wall 22, 24. The top surfaces of the support members 40 and 41 are in the same plane which is spaced below the forward wall 16.

Elongated bars 42 are provided spaced from the side walls 22, 24 and extending outwardly from the front surface of the bottom wall 20 to define a channel 44, as best shown in FIG. 3. The elongated bars 42 are shown as being disposed at all four corners of the bottom wall 20 formed by the shoulders 30 and the side walls 22, 24.

Notches or openings 46, 48 are formed in the side walls 22 and 24. The notches 46, 48 extend from the bottom wall 20 upward along the respective side wall and terminate a spaced distance from the forward wall 16. The notches 46, 48 are shown as being preferably tapered as they proceed upward from the bottom wall along the side walls. At the bottom wall 20, the notches 46, 48 form an arcuate opening in the bottom wall itself. The notches are shown as being formed at two locations of each side wall. On the side wall 22, the notch 46 is formed adjacent to the elongated bar 42 near the upper shoulder 30, and the other notch 48 is positioned slightly below the transverse center line of the base member 12, which center line passes through the hole 36. On the opposing side wall 24, the notch 46 is formed adjacent to the elongated bar 42 near the lower shoulder 30, and the other notch 48 lies along that same side wall 24 and is positioned slightly above the above mentioned transverse center line of the base member 12. It is clearly understood that by turning the base member 12, as shown in FIGS. 1 and 3, 180° that the notch 48 on side wall 22 will occupy the same space as the other notch 48 on side wall 24.

Downwardly sloped surfaces 50 are provided on the forward wall 16 adjacent the intersection with each of the side walls 22, 24. One downwardly sloped surface 50 is provided adjacent the side wall 22 at a position starting at the transverse center line and extending upwardly to a position near the support member 41 on side wall 22. The other sloped surface 50 is provided adjacent the other side wall 24 at a position also starting at the transverse center line and extending downwardly to a position near the other support member 41 on side wall 24. It is noted, one end of each sloped surface 50 proximates the commencement of the notches 48 adjacent thereto, so that each sloped surface 50 lies between a notch 48 at one side and a support member 41 at the other side thereof.

It should be appreciated that the base member is symmetrical along a diagonal line thereacross. Such diagonal symmetry permits positioning of the base member with respect to the electrical outlets with the top and bottom of the base member interchangeable. Regardless of which end is used as the top or bottom there will be provided identical features in the base member.

The insert member 14 includes a central transverse connecting bar 52 having perpendicular extensions 54, 56 extending in opposing directions from the opposite ends thereof and lying in a common plane with the bar 52 itself. Formed centrally of the connecting bar is a countersunk hole 58 which is positioned to be in alignment with the clearance hole 36. By means of a fastening member, such as a screw, inserted into the countersunk hole 58 and through the clearance hole 36, the insert member 14 can be securely held onto the base member 12, and in turn both the insert member 14 and the base member 12 are securely held onto the electrical outlet into which the fastening screw is threaded in a conventional manner.

Connected perpendicularly to each extension 54, 56, are integral hinges which include a hinge portion 60 formed of a reduced thickness section, and hinge plates 62, 64 formed on either side of the hinge 60. The hinge plates 62, 64 contain a V-shaped groove therebetween to form the reduced thickness section which constitures the integral hinge. Connected by means of the integral hinges are covers or doors 66 and 68.

Each of the covers 66, 68 are shaped in conformity with the recessed compartment in the base member 12 whereby, when the covers are closed, as shown in FIG. 2, the covers can completely fill the recessed compartment. The covers have straight edges 70, 72 which transversely cross the connecting bar 52 and lie in abutment with each other. The opposite edge of each cover has an arcuate edge 74 terminating in side shoulders 76 which corresponds to the shape of the upper and lower ends 26, 28 and shoulders 30 of the compartment itself.

The covers are positioned by means of the hinges so that they can each close onto the connecting bar from opposing sides, as best shown in FIGS. 1-3. One cover 68 will open from the left to the right, while the opposite cover 66 will open from the right to the left. In their closed position, the covers lie in a plane spaced in front of the connecting bar 52 by means of the height of the hinge.

Outwardly extending tabs 78 are formed along the outer edge 80 of each cover 66, 68 and are of a shape to snap into the side notches 46 formed in the side walls 22, 24 of the base member 12, as shown in FIG. 4.

Figure 5:
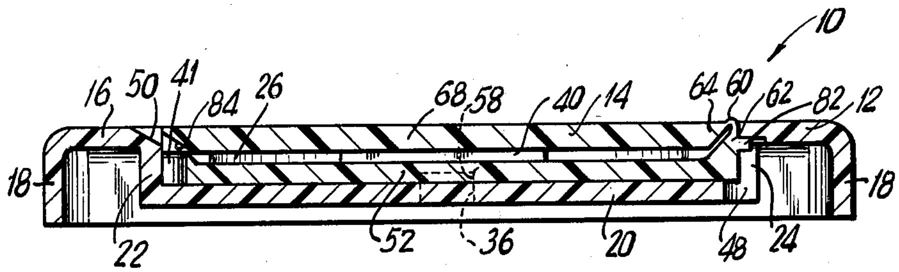
FIG. 5 is a sectional view taken along line 5—5 of FIG. 2.

Additional tabs 82 are formed along the hinge plate 62 and also extend outwardly so as also to engage notches 48 on the side walls 22, 24, as shown in FIG. 5. The set of tabs 78 are formed to engage the upper and lower notches 46 while the tabs 82 are positioned to engage the notches 48 adjacent the transverse center line.

Sloped surfaces 84 are formed on the inner surface of the covers adjacent the edges 80, so as to confront the corresponding sloped surfaces 50 formed in the forward wall 16 of the base member 12, as shown in FIG. 5. In this manner, the confronting sloping surfaces form a finger access means whereby the covers can be lifted open.

The thickness dimension of the hinge plates 62 is such that it will be received within the channels 44 defined between the elongated bars 42 and the side walls 22, 24. In this manner, the insert member 14 can be retained securely by means of the channels 44, and the tabs 82 which are inserted into the notches 48, and the insert member will be held in place. It should be appreciated that the insert member also provides diagonal symmetry, whereby it can be reversibly positioned with respect to the base member. Accordingly, the base member itself can be reversibly positioned with respect to the electrical outlet, and regardless of which way the base member is placed, the insert member itself can also be reversibly positioned with respect to the base member. As a result, assembly of the face plate is facilitated since no specific directional positioning is required.

In order to assemble the face plate, the insert member is positioned in the recessed compartment provided in the base member. In positioning the insert member, the hinge plates 62 are pressed into the channels 44 provided between the elongated bars 42 and the side walls 22, 24. The insert member is then pressed downward until the edges of the hinge plates reach the bottom wall 20. The outwardly extending tabs 82 from the hinge plates 62 will snap into place within the notches 48 and will be held thereby. The covers can then be closed by pressing downwardly so that the tabs 78, which extend outwardly from the edges of the covers, will snap into the notches 46 provided for them in the side walls 22, 24. The support members 40, 41 on the base member 12 will serve as supports while the covers are being pressed downwardly when closing the covers. When the covers are to be opened, by means of the finger access means 50, 84 provided by the confronting sloped sections, the covers can be pulled out so that the tabs 78 are released from the notches 46. Once the covers are opened, as shown in FIG. 3, the socket openings 32, 34 are uncovered and a conventional electrical plug can be inserted into the socket receptacle therebeneath.

Figure 6:
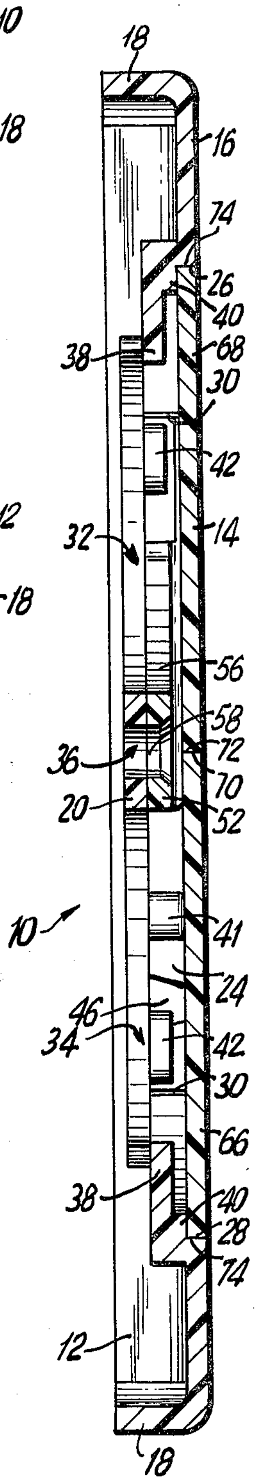
FIG. 6 is a sectional view taken along line 6—6 of FIG. 2.

As shown in FIGS. 4-6, the rearwardly extending flange 18 extends in a plane slightly below the plane of the bottom wall 20 of the recessed compartment. The support members 40 extend upwardly from the shelf 38 and the support members 41 extend upwardly from the bottom wall 20, and serve to support the covers 66, 68 when they are in a closed position. The thickness of each hinge 62 fits in the channel 44 provided between the elongated bar 42 and the side wall 22, 24 to securely hold the cover in place. It should be noted that the hinge 60 formed by the reduced cross section applies upward pressure to push the tab 78 towards the upper part of the notch 46 and holds the cover firmly in place. As can best be seen in FIGS. 4 and 5, by beveling the opposing edges of the hinge 60 into the V-shaped section, the cover is permitted to close downwardly and fit properly into place. Preferably, the width of the tab 78 should approximate the width at the top or roof of the notch 46 so that when the pressure of the hinge forces the tabs 78 to the upper section of the notch 46, it will substantially fill the notch 46 and be tightly held in place thereby.

Figure 7:
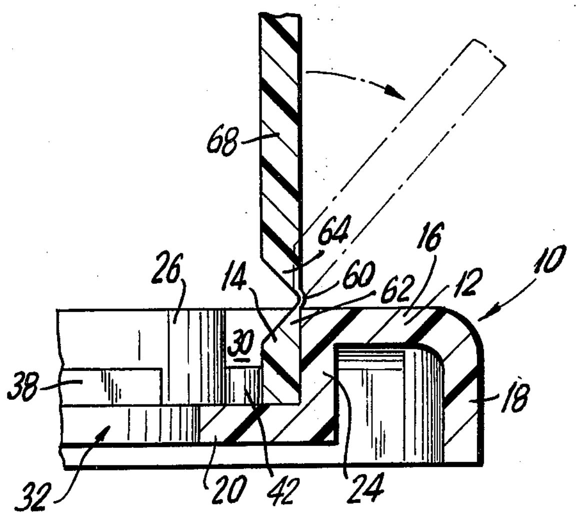
FIG. 7 is a fragmentary sectional view taken along line 7—7 of FIG. 3 showing the hinge for permitting the opening and closing of the cover.

As can best be appreciated from FIGS. 4-6, the height of the covers are flush with the top surface 16 of the outer shell. In this way a smooth flush face is provided to the face plate when the covers are held in a closed position. The hinge 60 is the only portion which extends slightly above the flush surface. However, the hinge provides a smooth edge which does not mar the aesthetic appearance of the flush surface. At the same time, when the covers are open, they completely reveal the socket openings which are needed for access to the electrical equipment. As best shown in FIG. 7, the cover can be opened and actually swung backwardly, as shown by the dotted line portion 86, in order to permit an electrical cord to be pushed against the open cover. The integral hinge permits complete pivoting of the cover through an angle of approximately 180° between a complete open position and a closed position.

Figure 8:
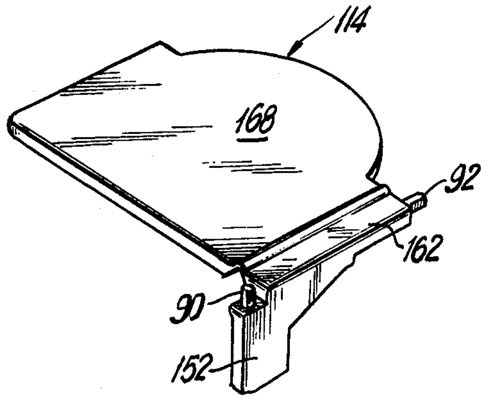
FIG. 8 is a fragmentary perspective view of a modified insert member.
Figure 9:
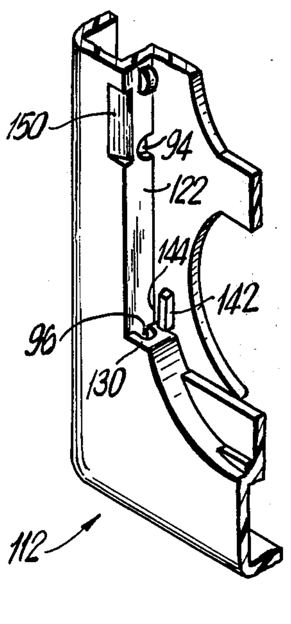
FIG. 9 is a fragmentary perspective view of a modified base member for the modified insert member of FIG. 8.
Figure 10:
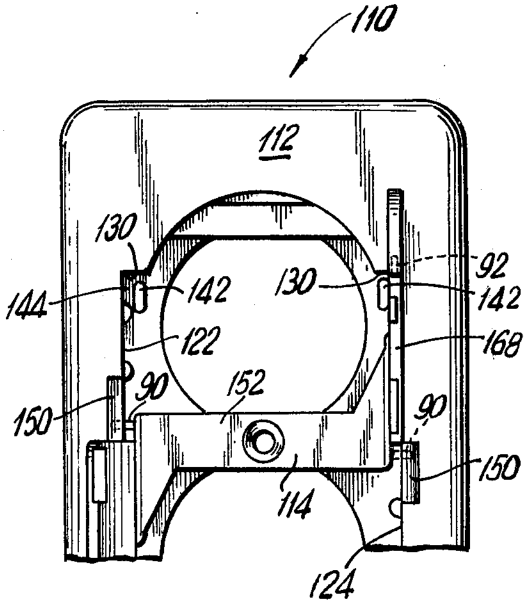
FIG. 10 is a fragmentary front elevational view of a modified face plate formed by the modified insert and base members of FIGS. 8 and 9, showing the covers of the insert member in their open positions.

FIGS. 8-10 disclose a slightly modified face plate 110, where only portions of the face plate sections are shown in order to clearly disclose the modifications thereof. The face plate 110 includes a base member 112 and a removable insert member 114, where for the most part these members are the same as base member 12 and insert member 14 set forth above. The only change or modification, is the replacement of the tab 82 on the insert member 14 and the modification of the notches 48 in the base member 12, as set forth hereinafter below.

As shown in FIG. 8, the connecting bar 152 is provided with a tab or projection 90, where the projection 90 is provided on both sides or ends of the connecting bar 152 as indicated in FIG. 10. Additionally, another tab or projection 92 is provided on the end of the hinge plate 162 of the cover 168. It is understood, that the hinge plate for the other cover (not shown) is also provided with a similar projection 92, where the insert member 114 is diagonally symmetrical in the same manner as the insert member 14 set forth above.

FIG. 9 shows a portion of the base member 112. An opening 94 is provided through the side wall 122 adjacent to the sloped surface 150. Additionally, another opening 96 is provided in the shoulder 130 at the end of the channel 144 which is provided between the side wall 122 and the elongated bar 142. It is understood, that the other side wall 124 is also provided with an opening 94 as indicated in FIG. 10, and that the opposite upper shoulder 130 at the end of side wall 124 is also provided with an opening 96 at the end of the channel 144 as also indicated in FIG. 10. It is again pointed out that the base member 112 is diagonally symmetrical in the same manner as the base member 12 set forth above.

Accordingly, when joining the insert member 114 to the base member 112, the hinge plates 162 are inserted into the channels 144 of the base member 112 so that the projections 92 are inserted into the openings 96 in the shoulders 130. Furthermore, the projections 90 at the opposite ends of the connecting bar 152 of the insert member 114 are inserted into the openings 94 in the side walls 122, 124. Thus, the projections 90, 92 cooperate with their associated openings, 94, 96 to securely hold the insert member 114 and base member 112 together as a unit as indicated in FIG. 10.

Numerous alterations of the structure herein disclosed will suggest themselves to those skilled in the art. However, it is to be understood that the present disclosure relates to a preferred embodiment of the invention which is for purposes of illustration only and is not to be construed as a limitation of the invention.

What is claimed is:

1. A face plate for an electrical outlet, said face plate comprising a base member having an outer shell adapted to be positioned over the electrical outlet, a recessed compartment provided within said outer shell and including a bottom wall having a pair of socket openings for alignment with a duplex socket receptacle disposed within the electrical outlet, a removable insert member received in said recessed compartment over said socket openings and providing in cooperation with said outer shell a substantially flush surface, said insert member having a pair of covers, each of said covers being selectively openable to uncover a respective one of said socket openings disposed therebeneath, cooperating securing means on said base member and said insert member for securely retaining said insert member in said recessed compartment, said base and insert members each being symmetrically structured so as to be reversibly positionable with respect to each other, said insert member including central connecting bar means through upright sections lying in a common plane with said connecting bar means, said upright sections opposedly extending perpendicularly from ends of said connecting bar means, integral hinges forwardly extending from said upright sections, each cover being coupled to a respective one of said integral hinges, whereby said covers can swing outwardly from said connecting bar means in opposing directions from each other.

2. A face plate as in claim 1, wherein said bottom wall includes a hole centrally located between said pair of socket openings, said connecting bar means having a hole therein aligned with said bottom wall hole, whereby said aligned holes are available for securely retaining said insert member in said base member and said base member to said electrical outlet.

3. A face plate as in claim 1, wherein said covers lie in a plane forward of said plane of said connecting bar means, said covers being symmetrical with each other and each having one edge centrally crossing said connecting bar means along its length in a closed position of said covers with said edges being in abutting relationship to each other, whereby a front face of said insert member is provided by said covers.

4. A face plate as in claim 3, wherein said integral hinges extend forward from said upright supports a distance which proximates recessed distance of said recessed compartment beneath said flush surface of said outer shell.

5. A face plate as in claim 1, wherein said outer shell includes a forward wall of substantially rectangular shape, a rearwardly directed peripheral flange provided around said forward wall, and said recessed compartment including rearwardly extending side walls interconnecting said bottom wall with said forward wall.

6. A face plate as in claim 5, and further including support means extending forward of said bottom wall and lying in a plane intermediate between said bottom wall and said forward wall for supporting said covers to lie in a common plane with said forward wall to provide said flush surface.

7. A face plate as in claim 5, and including projections outwardly extending from a periphery of said insert member, and apertures provided in said side walls for matingly engaging said projections, whereby said insert member can snap into said recessed compartment with said projections locking into said apertures.

8. A face plate as in claim 7, wherein one of said projections is disposed on each of said covers for retaining said covers in a closed position.

9. A face plate as in claim 7, wherein one of said projections is disposed on each of integral hinges connected to said covers respectively for securing said insert member to said base member.

10. A face plate as in claim 7, wherein one of said projections is disposed at opposite ends of said connecting bar means for securing said insert member to said base member.

11. A face plate as in claim 5, and further comprising first sloped surfaces provided on said forward wall adjacent its interconnection with said side walls, and opposing second sloped surfaces at an edge of said covers, said first and second sloped tapered surfaces providing finger access means for opening said covers.

12. A face plate for an electrical outlet, said face plate comprising a base member having an outer shell adapted to be positioned over the electrical outlet, a recessed compartment provided within said outer shell and including a bottom wall having a pair of socket openings for alignment with a duplex socket receptacle disposed within the electrical outlet, a removable insert member received in said recessed compartment over said socket openings and providing in cooperation with said outer shell a substantially flush surface, said insert member having a pair of covers, each of said covers being selectively openable to uncover a respective one of said socket openings disposed therebeneath, cooperating securing means on said base member and said insert member for securely retaining said insert member in said recessed compartment, said base and insert members each being symmetrically structured so as to be reversibly positionable with respect to each other, said outer shell including a forward wall of substantially rectangular shape, a rearwardly directed peripheral flange provided around said forward wall, and said recessed compartment including rearwardly extending side walls interconnecting said bottom wall and said forward wall, said cooperating securing means including bars spaced from said side walls and extending outwardly from a front surface of said bottom wall to define channels with said side walls, said insert member including transverse connecting bar means having forwardly extending integral hinges respectively interconnecting said covers and said connecting bar means, and said integral hinges having a thickness dimensioned to be tightly received in said channels.

13. A face plate as in claim 12, wherein said integral hinges have projections extending outwardly therefrom, and said side walls having openings therein at ends of said channels for receiving said projections therein to further secure said insert member to said base member.

14. A face plate as in claim 12, wherein said bottom wall includes a hole centrally located between said pair of socket openings, said connecting bar means having a hole therein aligned with said bottom wall hole, whereby said aligned holes are available for securely retaining said insert member in said base member and said base member to said electrical outlet.

15. A face plate for an electrical outlet, said face plate comprising a base member having an outer shell adapted to be positioned over the electrical outlet, a recessed compartment provided within said outer shell and including a bottom wall having a pair of socket openings for alignment with a duplex socket receptacle disposed within the electrical outlet, a removable insert member received in said recessed compartment over said socket openings and providing in cooperation with said outer shell a substantially flush surface, said insert member having a pair of covers, each of said covers being selectively openable to uncover a respective one of said socket openings disposed therebeneath, cooperating securing means on said base member and said insert member for securely retaining said insert member in said recessed compartment, said base and insert members each being symmetrically structured so as to be reversibly positionable with respect to each other, said outer shell including a forward wall of substantially rectangular shape, a rearwardly directed peripheral flange provided around said forward wall, and said recessed compartment including rearwardly extending side walls interconnecting said bottom wall with said forward wall, projections outwardly extending from a periphery of said insert member, and apertures provided in said side walls for matingly engaging said projections, whereby said insert member can snap into said recessed compartment with said projections locking into said apertures, said apertures extending upwardly from said bottom wall through said side walls and tapering inwardly in an upward direction and terminating in spaced relationship with said forward wall.

* * * * *